United States Patent [19]
Cheng

[11] Patent Number: 6,072,415
[45] Date of Patent: Jun. 6, 2000

[54] MULTI-MODE 8/9-BIT DAC WITH VARIABLE INPUT-PRECISION AND OUTPUT RANGE FOR VGA AND NTSC OUTPUTS

[75] Inventor: Yu-Chi Cheng, Fremont, Calif.

[73] Assignee: NeoMagic Corp., Santa Clara, Calif.

[21] Appl. No.: 09/182,346

[22] Filed: Oct. 29, 1998

[51] Int. Cl.[7] .............................. H03M 1/66; H04N 3/14
[52] U.S. Cl. .................... 341/144; 341/145; 348/308
[58] Field of Search .................................. 341/144, 145, 341/154; 348/308, 327, 298, 313

[56] References Cited

U.S. PATENT DOCUMENTS

| | | | |
|---|---|---|---|
| 4,016,555 | 4/1977 | Tyrrel | 341/144 |
| 4,482,887 | 11/1984 | Crauwels | 340/347 |
| 4,644,325 | 2/1987 | Miller | 341/144 |
| 4,804,960 | 2/1989 | Fernandes et al. | 341/158 |
| 4,998,108 | 3/1991 | Ginthner et al. | 341/145 |
| 5,017,919 | 5/1991 | Hull et al. | 341/136 |
| 5,164,725 | 11/1992 | Long | 341/118 |
| 5,257,027 | 10/1993 | Murota | 341/153 |
| 5,323,159 | 6/1994 | Imamura et al. | 341/145 |
| 5,539,405 | 7/1996 | Norsworthy | 341/153 |
| 5,541,598 | 7/1996 | Malek-Khosravi | 341/118 |
| 5,570,090 | 10/1996 | Cummins | 341/144 |
| 5,592,166 | 1/1997 | Wincn | 341/144 |
| 5,600,321 | 2/1997 | Wincn | 341/144 |
| 5,612,696 | 3/1997 | Kim | 341/136 |
| 5,638,011 | 6/1997 | Nguyen | 327/108 |
| 5,703,587 | 12/1997 | Clark et al. | 341/144 |
| 5,805,095 | 9/1998 | Humphreys et al. | 341/144 |
| 5,831,566 | 11/1998 | Ginetti | 341/144 |
| 5,870,049 | 2/1999 | Huang et al. | 341/144 |

*Primary Examiner*—Michael Tokar
*Assistant Examiner*—Peguy JeanPierre
*Attorney, Agent, or Firm*—Stuart T. Auvinen

[57] ABSTRACT

A digital-to-analog converter (DAC) is useful for driving both SVGA display monitors and NTSC TV monitors. The DAC converts 8-bit digital signals to analog voltage for SVGA, but converts 9-bit signals to a wider range of analog voltages for NTSC. Instead of doubling a number of current sources from 255 to 511 for 9-bit conversions, a single least-significant-bit (LSB) current source is added for 9-bit mode. The LSB current source adds one-half of the current that the other current sources do. The LSB current source is disabled for 8-bit mode. The current from the other current sources is doubled for 9-bit mode by adjusting the bias voltage. The bias voltage for p-channel transistors in all the current sources is lowered for 9-bit mode by a bias generator. The bias generator compares a voltage across an external resistor to a band-gap reference and adjusts the bias voltage until the voltage drop across the resistor matches the band-gap reference. To switch to 9-bit mode, the current in the bias generator is split in two by enabling another leg to ground in parallel with the resistor. The bias voltage is lowered until the current is doubled and the voltage drop again matches the reference.

14 Claims, 8 Drawing Sheets

MULTI-MODE 8/9-BIT DAC WITH VARIABLE INPUT-PRECISION AND OUTPUT RANGE FOR VGA AND NTSC OUTPUTS

FIELD OF THE INVENTION

This invention relates to digital-to-analog converters (DACs), and more particularly to multiple-mode DACs with variable precision and range.

BACKGROUND OF THE INVENTION

Digital signals produced by computer systems are often converted to analog voltages to drive user interfaces such as cathode-ray tube (CRT) displays. Many kinds of digital-to-analog converters (DACs) are known and used. One common type drives a variable current through a fixed resistance to produce a variable voltage across the resistor. The current and thus the voltage are varied by switching on or off many current sources. The precision of the DAC is determined by the size of the smallest current source that can be switched.

FIG. 1 illustrates a common 8-bit DAC. An 8-bit digital value is encoded with a binary value from 0 to 255, representing a digitized voltage. Decoder 12 fully decodes the 8-bit binary value into 255 signals that are output to bus 16. These 255 signals control 255 switchable current sources. As more of the current sources are switched on, the current output on line 14 increases, increasing the voltage across a resistance. For example, when the 8-bit binary value is 00000000, all current sources are off. When the binary value is 00000001, only one of the current sources, source 28, is on. The current through line 14 is i. When the binary value is 00000010, two of the current sources, sources 28, 22, are on. The current through line 14 is 2i. For 00000011, three sources 28, 22, 20 are on, and the current output is 3i. The maximum current, 255i, is output when all 255 sources 28, 22, 20 . . . 24, 26 are turned on.

Such a DAC is known as an 8-bit DAC, since it converts an 8-bit binary input into a current that varies in steps of $\frac{1}{255}^{th}$ of the output range. The current sources must be carefully matched to produce the same output current i, which is a very small current. Otherwise, the output can be non-linear with distortions.

Sometimes a higher precision is required, such as for a higher-resolution or high-color display. The current and voltage range of the DAC can be doubled by doubling the number of current sources. FIG. 2 shows a common 9-bit DAC. A 9-bit binary value is decoded into 511 signals by decoder 30. The 511 signals from decoder 30 are output on bus 38 to 511 current sources.

The 511 signals from bus 38 control 511 current sources 28, 22, 20, . . . 24, 26, . . . 34, 36. Each current source adds a current i to output line 14. The total current output on line 14 varies from zero to 511i in increments of i.

The higher precision 9-bit DAC requires twice as many current sources as does the 8-bit DAC, even though the input value increased by just one binary bit. Complexity of the DAC increases significantly when precision is increased by just one binary input bit.
Variable-Precision DAC Needed—FIG. 3

FIG. 3 highlights an application that could benefit from a variable-precision DAC. As features are added to personal computers (PCs), the hardware must be able to meet new demands. One feature being added to PCs is the ability to drive television monitors as well as CRT monitors. CRT monitors use computer-display standards such as VGA and SVGA. Television monitors use entirely different standards, such as the National Television Standards Committee (NTSC) format or the Phase-Alternating-Line (PAL) format.

Not only are different horizontal and vertical frequencies used for SVGA and NTSC, but voltage ranges also differ. NTSC requires a wider voltage range than SVGA.

Pixels generated by the PC may be displayed on either SVGA monitor 102 or NTSC TV monitor 104. While SVGA monitor 102 requires a voltage range of V, NTSC TV monitor 104 requires a larger voltage range, up to 2V. Even when the NTSC voltage range is less than 2V, but above V, an additional ($9^{th}$) input bit is used for NTSC pixels.

An 8-bit DAC can be used to drive SVGA monitor 102, while a separate 9-bit DAC is used to drive NTSC TV monitor 104. Although this is the most simple approach, the redundancy in DACs is undesirable. Instead, a variable DAC 100 is desirable. Such a variable DAC 100 would operate as an 8-bit DAC outputting a voltage range V when driving SVGA monitor 102, but change modes to operate as a 9-bit DAC outputting a voltage range 2V when driving NTSC TV monitor 104.

Some programmable or weighted DACs are known. See for example U.S. Pat. No. 5,570,090 by Cummins, assigned to Analog Devices Inc., and U.S. Pat. No. 4,482,887 by Crauwels, assigned to IBM Corp.

What is desired is a variable or programmable DAC. It is desired to operate the DAC with an 8-bit input for driving a SVGA monitor, but operate the DAC with a 9-bit input for driving a NTSC TV monitor. It is desired to operate the DAC with a wider output-voltage range for NTSC mode than for SVGA mode. A multi-mode DAC is desired.

SUMMARY OF THE INVENTION

A multi-mode digital-to-analog converter (DAC) has a bias-voltage generator for generating a bias voltage and a plurality of current sources. Each produces a current controlled by the bias voltage and outputs part of a base current. The base current is a current from zero to a maximum current with $2^N-1$ current increments, where N is a number of input bits to the multi-mode DAC in a lower-precision mode.

A least-significant-bit (LSB) current source produces a small current controlled by the bias voltage. It outputs the small current for adding to the base current. The LSB current source outputs the small current during a higher-precision mode in response to a least-significant bit of the input bits to the multi-mode DAC. The LSB current source does not output the small current during the lower-precision mode.

The small current is less than the current increments from the plurality of current sources. Thus the LSB current source outputs the small current for the higher-precision mode but not for the lower-precision mode.

In further aspects the plurality of current sources output a maximum current for the higher-precision mode that is double a maximum current output for the lower-precision mode. Thus currents are doubled for the higher-precision mode. The bias-voltage generator adjusts the bias voltage for the higher-precision mode by lowering the bias voltage. The bias voltage is thus changed when switching from the lower-precision mode to the higher-precision mode.

In still further aspects a digital input contains the input bits. The digital input includes N input bits for the lower-precision mode but N+1 bits for the higher-precision mode. N is 8 for the lower-precision mode but 9 digital bits are input to the multi-mode DAC for conversion to an analog voltage for the higher-precision mode. Thus the multi-mode DAC is an 8/9 bit DAC.

In other aspects a SVGA output drives a SVGA monitor with analog voltages converted from the N input bits when using the lower-precision mode. A NTSC output drives a NTSC TV monitor with the analog voltages converted from N+1 input bits when using the higher-precision mode. Thus the SVGA monitor is driven during the lower-precision mode but the NTSC TV monitor is driven by the multi-mode DAC during the higher-precision mode.

DETAILED DESCRIPTION

The present invention relates to an improvement in digital-to-analog converters (DACs). The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that a modified current source for the least-significant-bit (LSB) can be added to an 8-bit DAC to allow for 9-bit operation. The added LSB current source outputs just half of the current outputted by the other 255 current sources. Thus the LSB current source adds one-half of the 8-bit LSB current. The LSB current source is turned on only for 9-bit mode, and then only when the LSB of the 9 input bits is a 1.

Only one additional current source is added instead of doubling the number of current sources. The additional LSB current source can use half-sized transistors to achieve half current using the same bias voltages as the other 255 current sources. Using the same bias voltages for all current sources allows all currents to track temperature, process, and supply changes, making for a more linear output.

When used for driving NTSC or SVGA displays, the output-voltage range is doubled for 9-bit mode. Each of the 255 current sources produces a current of 2i rather than i by adjusting the bias voltage.

Figure 1:
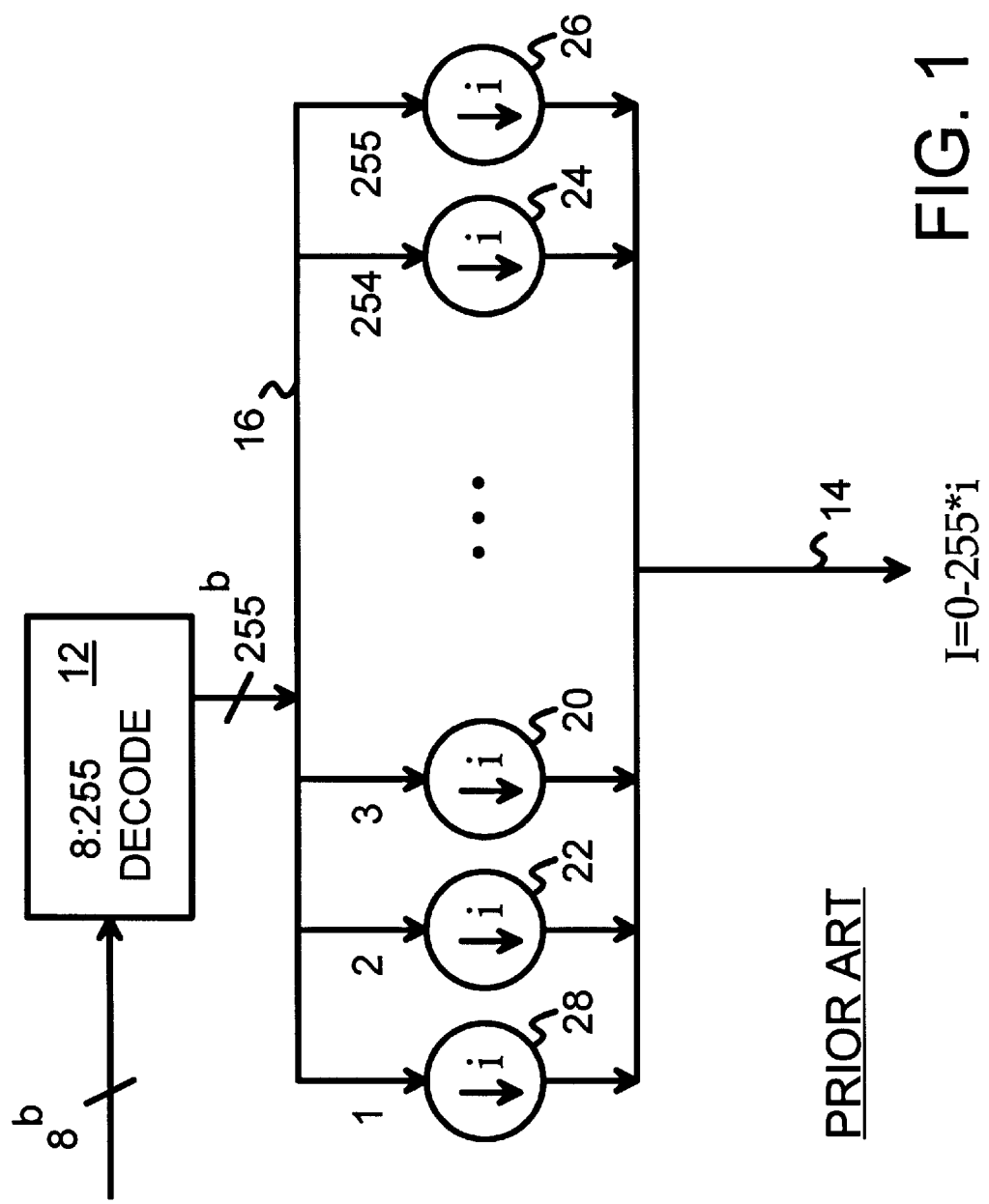
FIG. 1 illustrates a common 8-bit DAC.
Figure 2:
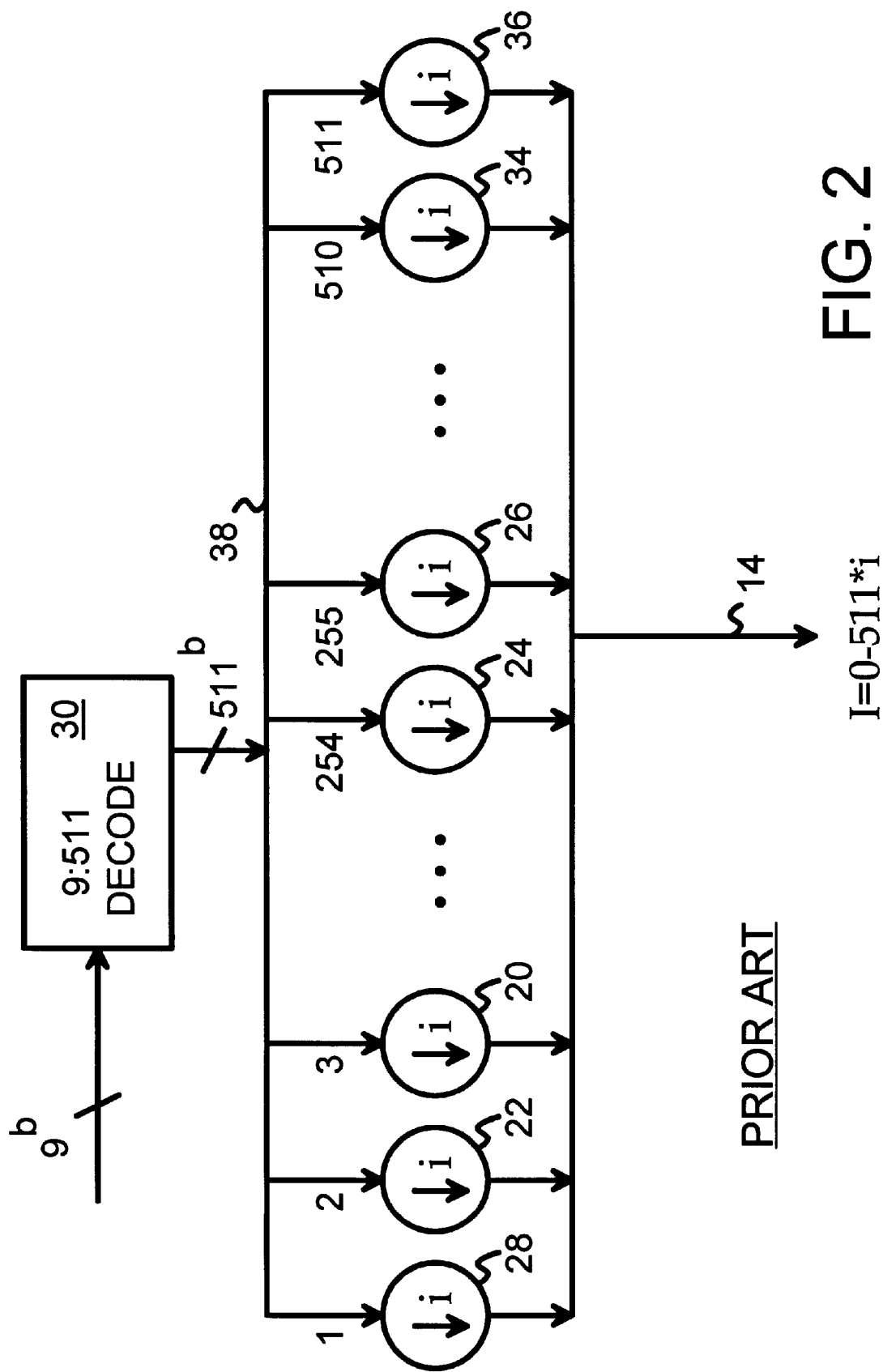
FIG. 2 shows a common 9-bit DAC.
Figure 3:
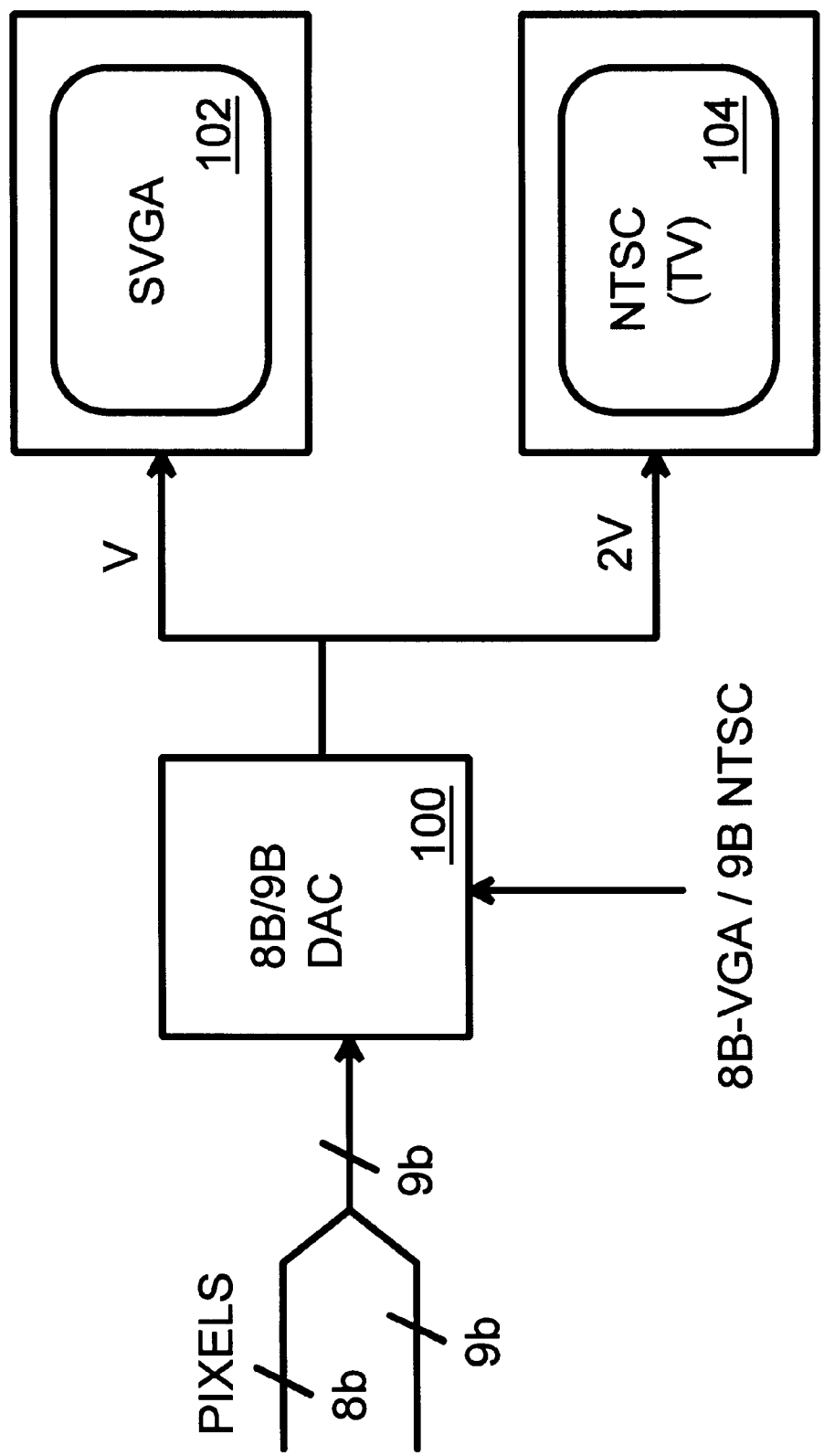
FIG. 3 highlights an application that could benefit from a variable-precision DAC.
Figure 4:
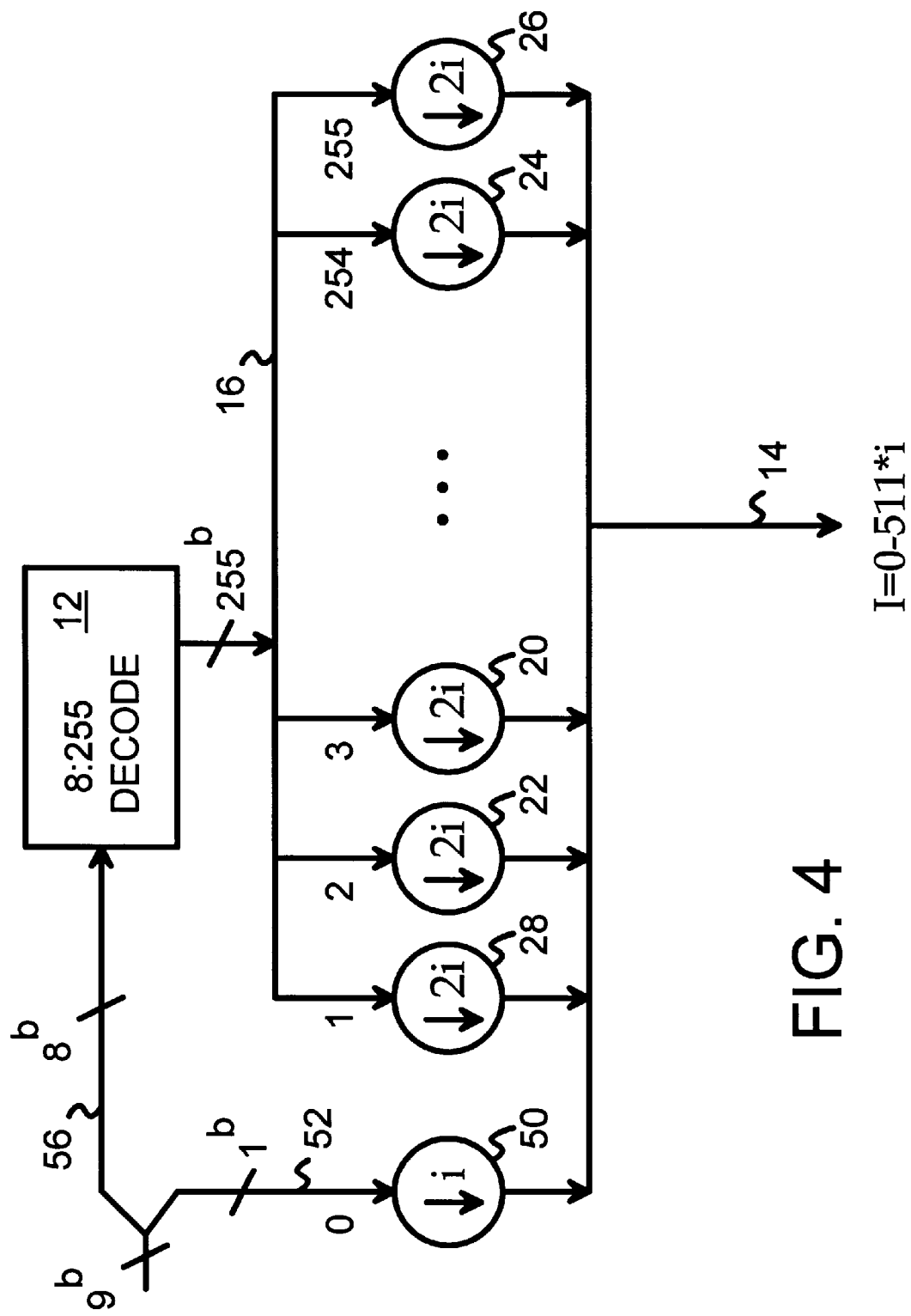
FIG. 4 is a variable 8/9-bit DAC operating in 9-bit mode.

FIG. 4 is a variable 8/9-bit DAC operating in 9-bit mode. A 9-bit digital-value pixel is received and the upper 8 most-significant-bits (MSBs) sent over bus 56 to decoder 12. The least-significant bit is sent to LSB current source 50 over line 52. LSB current source 50 is disabled for 8-bit mode and outputs zero current to output line 14. For 9-bit mode, LSB current source 50 outputs current i to output line 14 when the LSB is 1, but outputs no current when the LSB is 0. Thus LSB current source 50 is switched by the LSB of the 9-bit input to the DAC.

The upper 8 MSBs of the 9-bit input from bus 56 are fully decoded by decoder 12 to produce 255 switching signals on bus 16. These 255 switching signals from bus 16 control 255 current sources 28, 22, 20, . . . 24, 26. Each current source is biased to output 2i when its switching signal is 1, but zero current otherwise. Thus up to 255×2i can be output to output line 14 by the 255 current sources 28, 22, 20, . . . 24, 26. LSB current source 50 can add another i current to output line 14, so a maximum current of 255×2i+i can be produced, or 511i. The output current can be any value from zero to 511i in increments of i.

In 8-bit mode, a zero is output on line 52 to disable LSB current source 50 so that it outputs no current. The 8-bit input is sent over bus 56 and decoded by decoder 12 to control the 255 current sources 28, 22, 20, . . . 24, 26. The voltage bias to these current sources is adjusted so that each current source now outputs a current of only i rather than 2i. Thus the output current for 8-bit mode ranges from 0 to 255i in increments of i. The range is doubled for 9-bit mode, but the increment remains i. In 8-bit mode, the 8-bit pixel data is contained in the upper 8 MSBs of the 9-bit input to the DAC.

Figure 5:
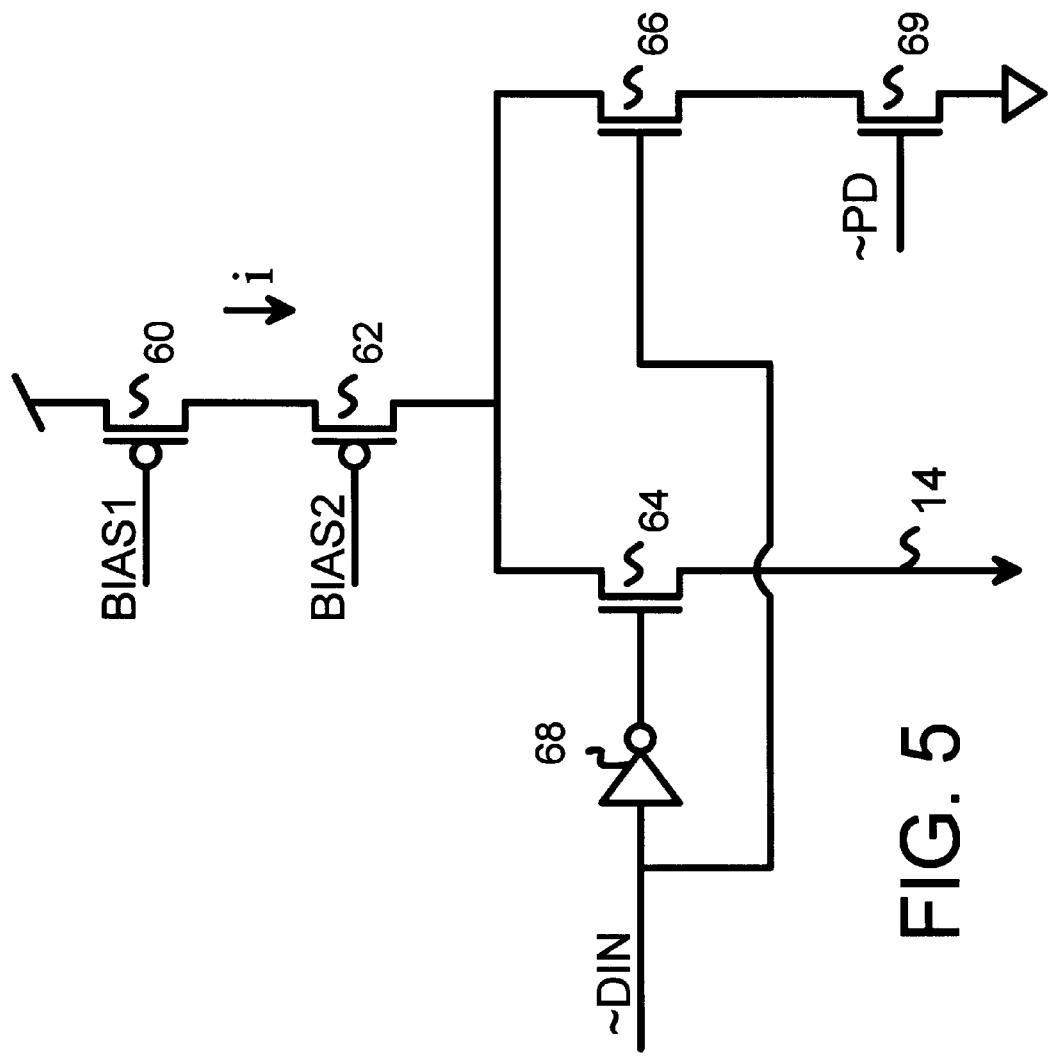
FIG. 5 is a schematic of a switchable current source.

Switchable Current Source—FIG. 5

FIG. 5 is a schematic of a switchable current source. Voltage biases BIAS1 and BIAS2 are generated by a bias voltage generator circuit and applied to the gates of p-channel transistors 60, 62. In 8-bit mode, BIAS1 and BIAS2 have voltages that produce a current of i through transistors 60, 62. In 9-bit mode, the bias voltages BIAS1 and/or BIAS2 are lowered so that a greater current 2i flows through transistors 60, 62 for the 255 current sources of FIG. 4. The LSB current source is similar but uses half-size transistors 60, 62, reducing the current to i from 2i.

The current i or 2i through p-channel transistors 60, 62 is switched either to output line 14 or to ground. When the switchable input signal ~DIN is low, inverter 68 drives the gate of n-channel transistor 64 high but the gate of n-channel transistor 66 low, switching the entire i or 2i current to output line 14 to be summed with currents from the other current sources. ~DIN is the inverse of the signals on bus 16 or line 52 of FIG. 4. Inverter 68 can drive transistor 66 rather than transistor 64 when DIN rather than ~DIN is available from the decoder or input.

When the switchable input signal ~DIN is high, inverter 68 drives the gate of n-channel transistor 64 low but the gate of n-channel transistor 66 high, switching the entire i or 2i current to ground through transistor 69. No active current is switched to output line 14, although some small leakage or sub-threshold current can be output from the current source.

During a power-own mode, signal ~PD is low, shutting n-channel transistor 69 off. One or both of the bias voltages BIAS1, BIAS2 can also be driven high to shut off the current from the power supply.

Figure 6:
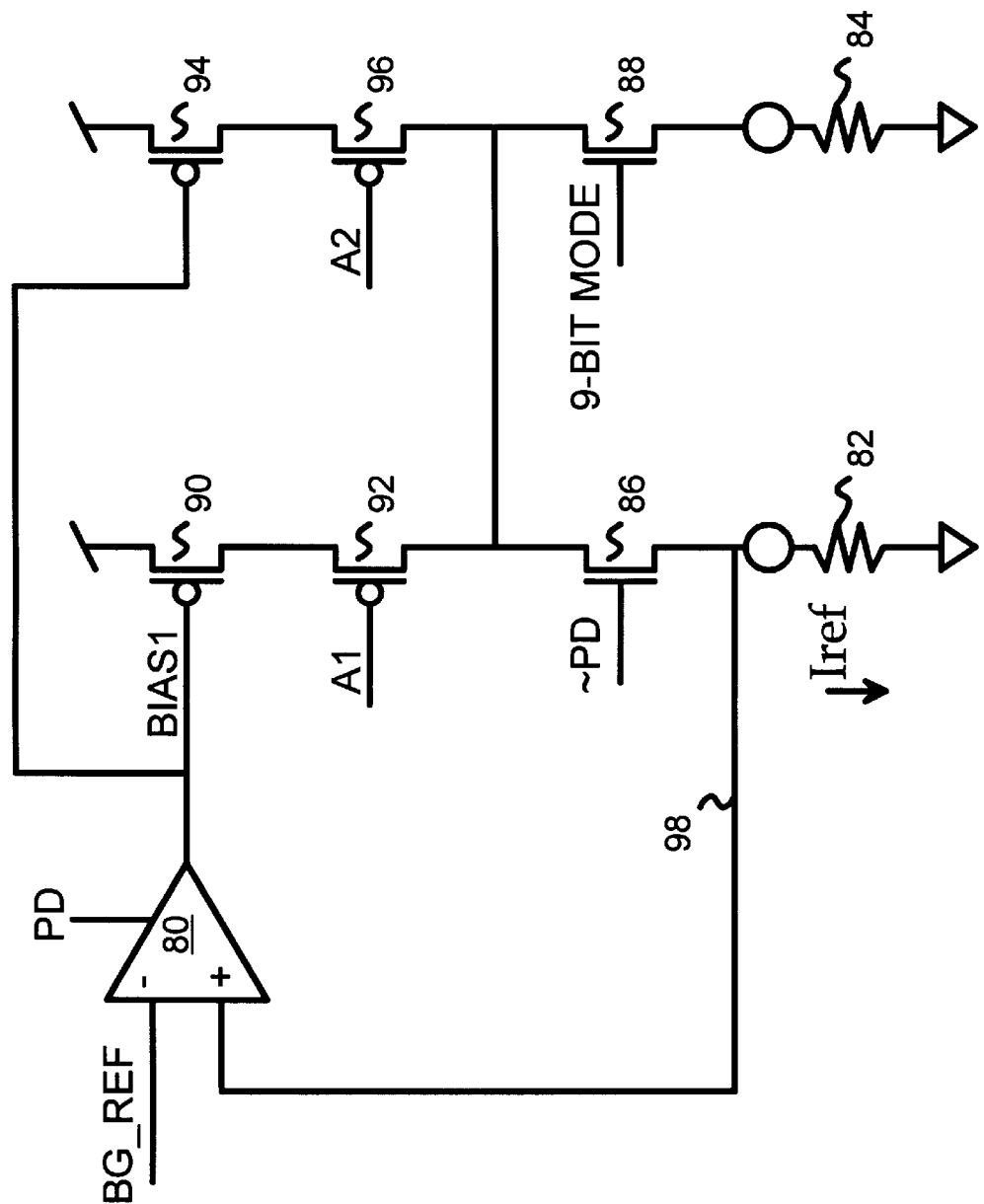
FIG. 6 is a schematic of a bias-voltage generator that adjusts the bias voltage for 8-bit or 9-bit modes.

Adjustable Bias-Voltage Generator—FIG. 6

FIG. 6 is a schematic of a bias-voltage generator that adjusts the bias voltage for 8-bit or 9-bit modes. The current output from the current sources is controlled by bias voltages BIAS1 and BIAS2. BIAS2 of FIG. 5 can be connected to a constant voltage such as ground while BIAS1 is output from the bias-voltage generator of FIG. 6.

During normal operation, A1 is low and A2 is high, so p-channel transistor 96 is off. Transistor 96 and A2 are turned on for diagnostic modes to adjust the current. Otherwise, transistor 96 is off and no current flows through transistors 94, 96. P-channel transistors 90, 92 supply a current proportional to i during 8-bit mode, but proportional to 2i during 9-bit mode. Transistors 90, 92 are designed to match transistors 60, 62 of the current source of FIG. 5, producing a current Iref that is proportional to i, differing by a scale factor.

Resistor 82 is a high-precision resistor, such as an external resistor. A current of Iref normally flows through resistor 82, producing a voltage drop of Iref*R. The values of resistor R and the current Iref are chosen so that the voltage drop Iref*R is equal to a band-gap reference voltage BG_REF, about 1.23 volts. The voltage on feedback line 98 is almost equal to BG_REF in normal operation because of the high gain of a comparator or operational amplifier, opamp 80.

When the feedback voltage does not match BG_REF, opamp 80 adjusts bias voltage BIAS1 to compensate. For example, when the feedback voltage is lower than BG_REF, opamp 80 reduces BIAS1. Lowering BIAS1 increases the current through p-channel transistor 90, increasing the current Iref. The higher current Iref produces a larger voltage drop Iref*R through resistor 82, raising the feedback voltage on line 98. Once the feedback voltage rises to match BG_REF, BIAS1 stabilizes.

When the DAC is switched from 8-bit mode to 9-bit mode, the bias voltage BIAS1 is adjusted to increase the current from Iref to 2*Iref. Initially, during 8-bit mode, a steady-state current Iref flows through resistor 82, setting BIAS1 to produce a current of Iref through transistors 90, 92. Mode transistor 88 is off, so all the current flows through resistor 82.

When the mode is changed to 9-bit mode, signal 9BIT_MODE goes high, turning n-channel mode transistor 88 on. Suddenly, the current Iref from p-channel transistors 90, 92 is split into two branches. Resistor 84 matches resistor 82, and n-channel mode transistor 88 matches transistor 86, so the current Iref is split in half. Resistor 82 now has a current of only Iref/2, so the feedback voltage drops in half. In response to the lower non-inverting input compared to the band-gap voltage BG_REF, opamp 80 reduces bias voltage BIAS1. The lower BIAS1 increases the current through p-channel transistor 90, increasing the current through the two resistors 82, 84. Eventually the current generated by BIAS1 reaches 2*Iref, so that a current of Iref flows through each of the two branches. Then the current through resistor 82 reaches Iref, producing a feedback voltage that is again equal to the band-gap reference BG_REF.

The bias generator can be powered down by asserting the ~PD signal low. This disables n-channel transistor 86, blocking current flow. Opamp 80 is also powered down, forcing bias voltage BIAS1 to the power-supply voltage. Alternately, BIAS2 can be driven by the power-down signal PD so that the p-channel transistors in the current sources driven by BIAS2 are shut off during power-own mode. Resistors 82 and 84 are high-precision off-chip resistors. Each resistor is connected to a separate package pin.

Figure 7:
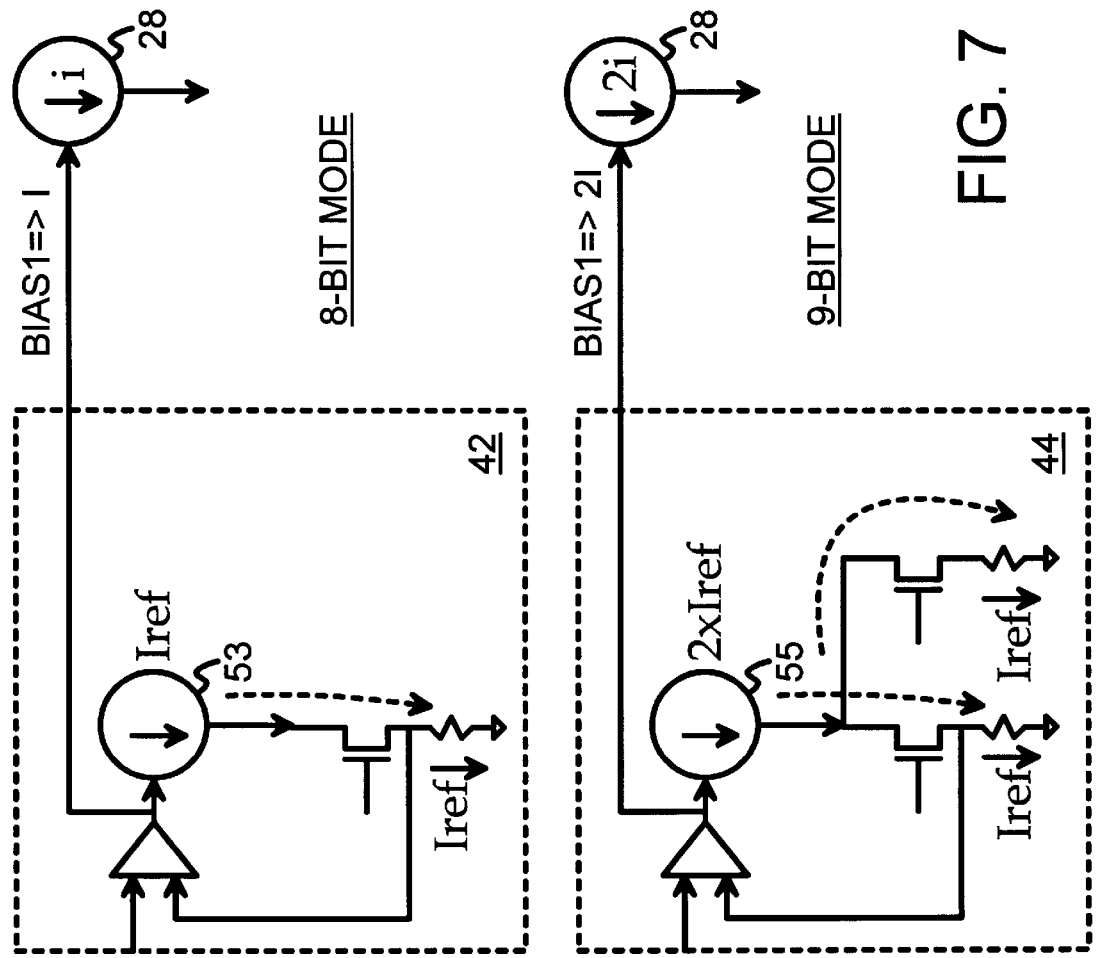
FIG. 7 highlights how the adjustable bias-voltage generator operates for 8-bit and 9-bit modes.

FIG. 7 highlights how the adjustable bias-voltage generator operates for 8-bit and 9-bit modes. For 8-bit mode, the current sources are biased to each generate a current i. The bias voltage BIAS1 causes current source 28 to output current i. BIAS1 is around 1.8v when the power supply is 3.3v. Bias Generator 42 is the bias generator of FIG. 6 operating in 8-bit mode, where the right branches are disabled. The feedback voltage cause the opamp to generate bias voltage BIAS1 so that a current of Iref is produced by the p-channel transistor current source 53 in the bias generator. This current Iref is then mirrored and scaled to generate the desired current i in each current source. Current Iref flows through the resistor that generates the feedback voltage.

In 9-bit mode, the bias voltage BIAS1 is lowered. Each current source 28 then produces a current of 2i, except the LSB current source which produces current i. A second branch or leg to ground is enabled in bias generator 44, splitting the current from current source 55. The opamp forces the current from current source 55 to increase until the current through the resistor generating the feedback voltage rises back to Iref. A total current of 2*Iref is required from current source 55. The bias voltage BIAS1 is thus adjusted to produce a current of 2*Iref from current source 55 in bias generator 44.

The bias voltage BIAS1 is thus adjusted so that the current sources generate a current i during 8-bit mode, but a current of 2i during 9-bit mode. Since p-channel current sources are used, the bias voltage BIAS1 is actually lowered in voltage to increase the current drive of the p-channel transistors for 9-bit mode. The same bias generator of FIG. 6 is used for both modes and is shown twice as bias generator 42, 44 of FIG. 7.

Figure 8:
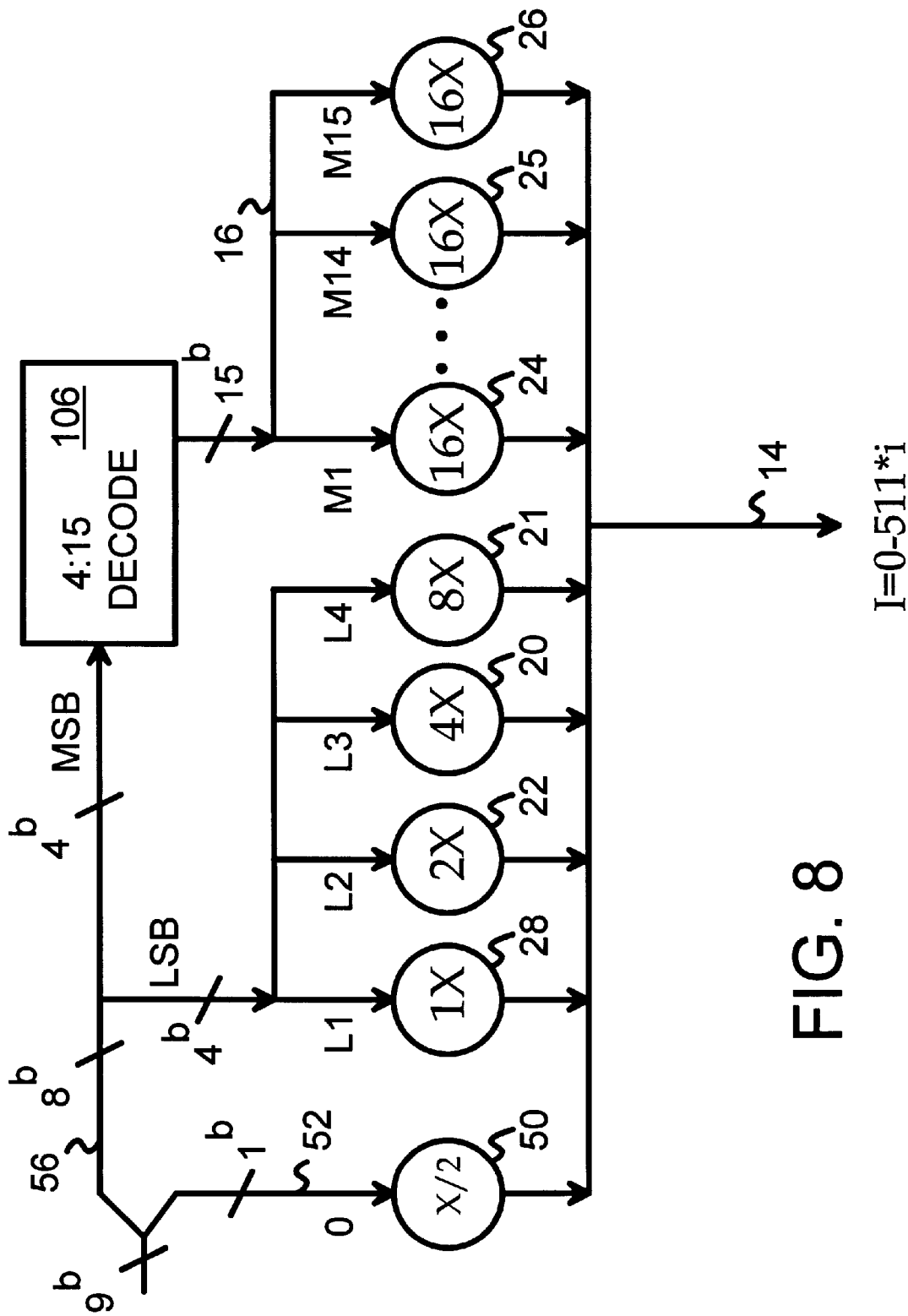
FIG. 8 is a diagram of an alternate embodiment that uses scaled current sources.

Scaled Current Sources—FIG. 8

FIG. 8 is a diagram of an alternate embodiment that uses scaled current sources. Rather than use 255 individual current sources, each producing a current of i or 2i, different sizes of current sources can be used. LSB current source 50 is controlled by the 9-bit LSB on line 52 as described before in FIG. 4. The upper 8 MSB's on bus 56 are split into two 4-bit nibbles. The lower 4 bits each directly control a scaled current source. The lowest of these bits (L1) controls scaled current source 28, which is 1× in size, producing a current of i for 8-bit mode, or 2i for 9-bit mode. Then next bit L2 controls current source 22, a 2×-sized current source, producing a current of 2i for 8-bit mode, and 4i for 9-bit mode.

The third bit L3 controls current source 20, a 4×-sized current source, producing a current of 4i for 8-bit mode, and 8i for 9-bit mode. Finally, the fourth bit L4 controls current source 21, a 8×-sized current source, producing a current of 8i for 8-bit mode, and 16i for 9-bit mode. The scaled current sources can be produced by increasing a number of transistor legs (the transistor width W) by the scaling factor (1×, 2×, 4×, or 8×).

The upper 4 MSBs from bus 56 are decoded by decoder 106 into a thermometer code. The binary value of the 4 MSBs is converted into its equivalent binary number (0 to 15) on bus 16, which determines a number of upper current sources that are switched on. Decoder 106 produces 15 outputs M1 to M15, which each control one of the upper. current sources 24, . . . 25, 26. Each of the 15 upper current sources 24, . . . 25, 26 are 16× in size, producing a current of 16i for 8-bit mode, and 32i for 9-bit mode.

The total current output to line 14 still varies from 0 to 511i for 9-bit mode, or 0 to 255i for 8-bit mode. This DAC architecture minimizes the DAC output glitch, but still requires the same amount of current from the current sources.

ADVANTAGES OF THE INVENTION

A variable or programmable DAC operates with an 8-bit input for driving a SVGA monitor, but operates with a 9-bit input for driving a NTSC TV monitor. The DAC operates with a wider output-voltage range for NTSC mode than for SVGA mode. The DAC is a multi-mode DAC, eliminating a need for a second DAC for the TV output.

Only one additional current source for the LSB is added instead of doubling the number of current sources. Since the bias voltage is adjusted, tracking is good without turning on or off devices in each current source. Redundant current sources or entire DACs are avoided. The same current sources in the same DAC are used for two purposes, for driving SVGA and TV displays.

ALTERNATE EMBODIMENTS

Several other embodiments are contemplated by the inventor. For example several DACs may be used in parallel, such as for driving multiple analog lines to the SVGA or TV monitor. One DAC can be used for each of the primary color components R, G, B. Luminance, Chrominance, and Composite video outputs can each be provided with a DAC.

Rather than doubling the output-voltage range, a smaller increase can be obtained by adjusting the bias voltage to the current sources. The resistance can also be changed to adjust the voltage when the current is doubled. The currents for 8 and 9-bit modes can be adjusted by changing the relative resistances of the resistors in the two branches of the bias generator of FIG. 6. Multiplexes or switching logic can be added to the input bus to switch signals for 8-bit pixels to the 8 MSB lines, or 9-bit pixels to the 9 input lines.

The foregoing description of the embodiments of the invention has been presented for the purposes of illustration and description. It is not intended to be exhaustive or to limit the invention to the precise form disclosed. Many modifications and variations are possible in light of the above-teaching. It is intended that the scope of the invention be limited not by this detailed description, but rather by the claims appended hereto.

I claim:

1. A multi-mode digital-to-analog converter (DAC) comprising:
    a bias-voltage generator for generating a bias voltage;
    a plurality of current sources, producing currents controlled by the bias voltage, for outputting a base current, the base current being a current from zero to a maximum current with $2^N-1$ current increments, where N is a number of input bits to the multi-mode DAC in a lower-precision mode; and
    a least-significant-bit (LSB) current source, producing a small current controlled by the bias voltage, for outputting the small current for adding to the base current, the LSB current source outputting the small current during a higher-precision mode in response to a least-significant bit of the input bits to the multi-mode DAC, the LSB current source not outputting the small current during the lower-precision mode;
    wherein the small current is less than the current increments from the plurality of current sources,
    whereby the LSB current source outputs the small current for the higher-precision mode but not for the lower-precision mode.

2. The multi-mode DAC of claim 1 wherein the plurality of current sources output
    a maximum current for the higher-precision mode that is double a maximum current output for the lower-precision mode,
    whereby currents are doubled for the higher-precision mode.

3. The multi-mode DAC of claim 2 wherein the bias-voltage generator adjusts the bias voltage for the higher-precision mode by lowering the bias voltage,
    whereby the bias voltage is changed when switching from the lower-precision mode to the higher-precision mode.

4. The multi-mode DAC of claim 2 wherein the small current from the LSB current source is one-half of the current increments of the plurality of current sources during the higher-precision mode.

5. The multi-mode DAC of claim 2 wherein the multi-mode DAC further comprises:
    a digital input containing the input bits, the digital input including N input bits for the lower-precision mode but N+1 bits for the higher-precision mode.

6. The multi-mode DAC of claim 5 wherein N is 8 for the lower-precision mode
    but 9 digital bits are input to the multi-mode DAC for conversion to an analog voltage for the higher-precision mode,
    whereby the multi-mode DAC is an 8/9 bit DAC.

7. The multi-mode DAC of claim 5 wherein the multi-mode DAC further comprises:
    a SVGA output for driving a SVGA monitor with analog voltages converted from the N input bits when using the lower-precision mode;
    a NTSC output for driving a NTSC TV monitor with the analog voltages converted from N+1 input bits when using the higher-precision mode,
    whereby SVGA monitor is driven during the lower-precision mode but the NTSC TV monitor is driven by the multi-mode DAC during the higher-precision mode.

8. A dual-mode digital-to-analog converter (DAC) comprising:
    a digital input having N input signals during a low mode and N+1 input signals during a high mode, the N+1 input signals including an expansion input signal not in the N input signals;
    a decoder, receiving at least some of the N input signals from the digital input, for generating switch signals;
    switchable current sources, coupled to an output, for switching current to the output in response to the switch signals, the switchable current sources switching an integer multiple of a minimum current to the output; and
    a least-significant-bit (LSB) switchable current source, coupled to the expansion input signal from the digital input, for switching a half current to the output in response to the expansion input signal during the high mode, the half current being half of the minimum current;
    wherein the LSB switchable current source is disabled during the low mode, whereby the half current is switched to the output during the high mode but not during the low mode.

9. The dual-mode DAC of claim 8 wherein the switchable current sources and the LSB switchable current source each comprise:
    a p-channel transistor having a gate controlled by a bias voltage, the p-channel transistor generating a sourced current in response to the bias voltage;
    an n-channel switch transistor, coupled to a control signal, for coupling the sourced current to the output; and
    an n-channel bypass transistor, coupled to an inverse of the control signal, for coupling the sourced current to a ground and not to the output.

10. The dual-mode DAC of claim 9 wherein the p-channel transistor in the LSB switchable current source is half a size of a smallest p-channel transistor in the switchable current sources,
    wherein the minimum current during the high mode is double the minimum current during the low mode.

11. The dual-mode DAC of claim 9 further comprising:
    an n-channel power-down transistor, coupled to the n-channel bypass transistor, for disabling the sourced current from reaching the ground during a power-down mode.

12. The dual-mode DAC of claim 9 further comprising:

a bias generator for generating the bias voltage, the bias generator including:

a precision resistor for generating a feedback voltage when a reference current is passed through the precision resistor;

a reference current source controlled by the bias voltage, the reference current source generating a primary current in response to the bias voltage; and a comparator, receiving the feedback voltage and a reference voltage, for generating the bias voltage, the comparator adjusting the bias voltage in response to a difference between the feedback voltage and the reference voltage but not adjusting the bias voltage when the feedback voltage matches the reference voltage;

mode means, coupled to the reference current source, for coupling all of the primary current to the precision resistor during the low mode, but diverting some of the primary current during the high mode, wherein the reference current through the precision resistor equals the primary current during the low mode, but the reference current is less than the primary current during the high mode, the comparator adjusting the bias voltage when the mode means diverts some of the primary current to increase the primary current.

13. The dual-mode DAC of claim 12 wherein the reference current source comprises a p-channel transistor having a gate coupled to the bias voltage.

14. The dual-mode DAC of claim 13 wherein N is 8 and wherein the current switched to the output varies from zero to 255 times the minimum current with the digital input during the low mode, but varies from zero to 255.5 times the minimum current with the digital input during the high mode.

* * * * *